(12) United States Patent
Terui et al.

(10) Patent No.: US 11,634,630 B2
(45) Date of Patent: Apr. 25, 2023

(54) PHOSPHOR AND LIGHT SOURCE DEVICE

(71) Applicant: TDK CORPORATION, Tokyo (JP)

(72) Inventors: Tatsuya Terui, Tokyo (JP); Masato Sato, Tokyo (JP)

(73) Assignee: TDK CORPORATION, Tokyo (JP)

( * ) Notice: Subject to any disclaimer, the term of this patent is extended or adjusted under 35 U.S.C. 154(b) by 17 days.

(21) Appl. No.: 16/982,968

(22) PCT Filed: Mar. 11, 2019

(86) PCT No.: PCT/JP2019/009766
§ 371 (c)(1),
(2) Date: Sep. 21, 2020

(87) PCT Pub. No.: WO2019/181618
PCT Pub. Date: Sep. 26, 2019

(65) Prior Publication Data
US 2021/0017447 A1 Jan. 21, 2021

(30) Foreign Application Priority Data
Mar. 23, 2018 (JP) .............................. JP2018-056861

(51) Int. Cl.
*C09K 11/77* (2006.01)
*H01L 33/50* (2010.01)

(52) U.S. Cl.
CPC ........ *C09K 11/7721* (2013.01); *H01L 33/502* (2013.01)

(58) Field of Classification Search
CPC .......................... C09K 11/7721; H01L 33/502
See application file for complete search history.

(56) References Cited

U.S. PATENT DOCUMENTS

| | | | |
|---|---|---|---|
| 2013/0306874 A1 | 11/2013 | Yoshikawa et al. | |
| 2015/0083967 A1 | 3/2015 | Watanabe et al. | |
| 2016/0240748 A1 | 8/2016 | Inomata et al. | |
| 2017/0044433 A1* | 2/2017 | Kamada | C09K 11/77 |
| 2017/0283697 A1* | 10/2017 | Aboulaich | C04B 35/505 |
| 2018/0044588 A1 | 2/2018 | Watanabe et al. | |

(Continued)

FOREIGN PATENT DOCUMENTS

| JP | 2010-024278 A | 2/2010 |
|---|---|---|
| JP | 2012-066994 A | 4/2012 |

(Continued)

OTHER PUBLICATIONS

Sep. 29, 2020 International Preliminary Report on Patentability issued in International Patent Application No. PCT/JP2019/009766.

(Continued)

*Primary Examiner* — Jonathan Han
(74) *Attorney, Agent, or Firm* — Oliff PLC

(57) ABSTRACT

A phosphor and a light source device having the phosphor having a high internal quantum yield by enabling a large Ce amount, capable of shifting the fluorescence wavelength of yellow fluorescence to the long wavelength side, having satisfactory heat quenching resistance, and excellent in blue light transmittance. The phosphor includes a Ce:YAG single crystal having a Ce amount of 0.7 parts by mole or more when the total amount of Y and Ce is 100 parts by mole.

9 Claims, 1 Drawing Sheet

(56) References Cited

U.S. PATENT DOCUMENTS

| | | | | |
|---|---|---|---|---|
| 2019/0264100 A1* | 8/2019 | Cozzan | ................ | H01L 33/502 |
| 2020/0220052 A1 | 7/2020 | Inomata et al. | | |
| 2020/0362238 A1* | 11/2020 | Foster | .................... | C30B 29/22 |

FOREIGN PATENT DOCUMENTS

| | | | |
|---|---|---|---|
| JP | 2013-043960 | A | 3/2013 |
| JP | 2015-081314 | A | 4/2015 |
| JP | 2017-110042 | A | 6/2017 |
| JP | 2019-056038 | A | 4/2019 |
| WO | 2012/005202 | A1 | 1/2012 |
| WO | 2013/161683 | A1 | 10/2013 |
| WO | 2015/166999 | A1 | 11/2015 |

OTHER PUBLICATIONS

T. Fukuda V. I. Chani (Eds.), Additive Manufacturing and Strategic Technologies in Advanced Ceramincs, 2016, pp. 117-118.

Jun. 11, 2019 International Search Report issued in International Patent Application No. PCT/JP2019/009766.

Yokota, Y. [et al.]: Improvement of dopant distribution in radial direction of single crystals grown by micro-pulling-down method, In: J. Cryst. Growth, Bd. 474, 2017, S. 178-182.—ISSN 0022-0248.

Rejman, M [et al.]: Temperature dependence of CIE-x,y color coordinates in YAG:Ce single crystal phosphor, In: J. Lumin., Bd. 187, 2017, S. 20-25.—ISSN 0022-2313.

Park et al., "High power and temperature luminescence of $Y_3Al_5O_{12}Ce^{3+}$ bulky and pulverized single crystal phosphors by a floating-zone method", Journal of Luminescence, No. 168, p. 334-338, Sep. 2, 2015.

Yang et al., "The growth and luminescence properties of $Y_3Al_5O_{12}Ce^{3+}$ single crystal by doping $Gd^{3+}$ for W-LEDs", Materials Letters, No. 170, p. 58-61, Feb. 2, 2016.

\* cited by examiner

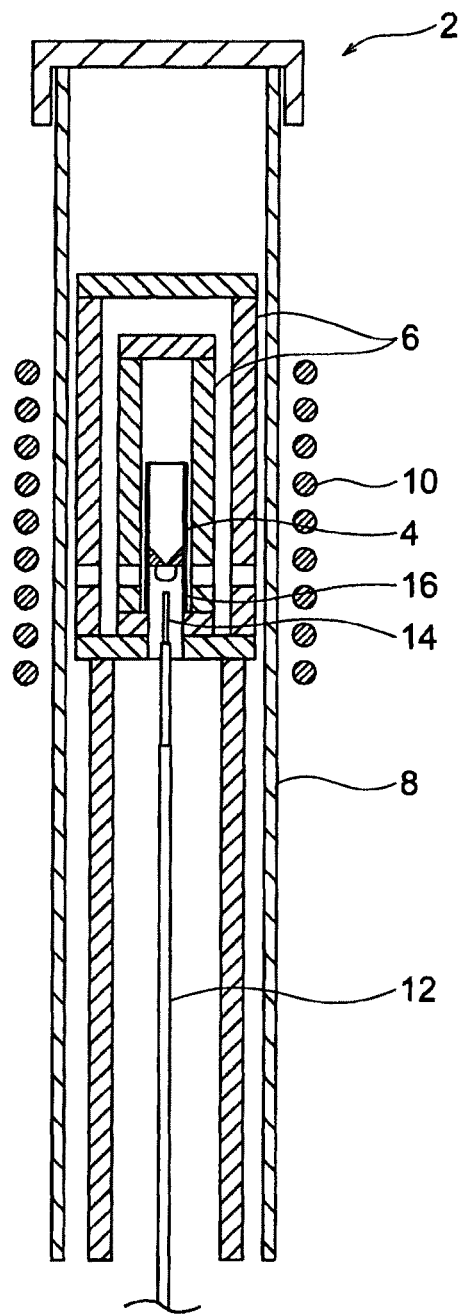

PHOSPHOR AND LIGHT SOURCE DEVICE

TECHNICAL FIELD

The present invention relates to a phosphor and a light source device using the phosphor.

BACKGROUND ART

A light emitting device has been studied that includes a blue light emitting diode emitting blue light and a phosphor emitting yellow fluorescence when excited by receiving the blue light of the blue light emitting diode and emits white light by mixing the yellow fluorescence with the blue light (blue transmitted light) transmitted through the phosphor (Patent Document 1).

Mainly used as the phosphor are a Ce:YAG single crystal (Patent Document 1), polycrystalline ceramic (Patent Document 2), and a eutectic made of Ce:YAG and $Al_2O_3$ (Patent Document 3).

However, although the single crystal described in Patent Document 1 is generated by the Czochralski (CZ) method, the single crystal is problematic in that sufficient white light cannot be obtained.

In addition, the segregation coefficient of Ce concentration of the single crystal generated by the CZ method is approximately 0.1 to 0.2 (Non-Patent Document 1) and low uniformity is another problem caused by the single crystal.

In addition, the transparent polycrystalline ceramic described in Patent Document 2 is problematic in that "heat quenching" occurs in which luminous efficiency declines at a high temperature. Further, the transparent polycrystalline ceramic described in Patent Document 2 is problematic in that the blue transmitted light decreases due to scattering at a grain boundary and no sufficient luminous intensity can be obtained during use as a light source.

In addition, the eutectic described in Patent Document 3 is problematic in that the blue transmitted light decreases due to scattering at a phase boundary and no sufficient luminous intensity can be obtained during use as a light source.

Further, the wavelength of yellow fluorescence generally used for a white light source is 530 nm to 540 nm and the wavelength of the blue transmitted light is 405 nm to 460 nm. There is a deviation on a chromaticity table between these mixed beams and the JIS standard white color, and yellow fluorescence with a longer wavelength is required to obtain the JIS standard white color.

In addition, in recent years, the demand for laser illumination that uses laser as the excitation light of a phosphor is on the increase. Accordingly, the temperature of the phosphor increases during laser output, and thus a higher level of heat quenching resistance is required.

CITATION LIST

Patent Document

Patent Document 1: JP 2015-81314 A
Non-Patent Document 1: T. Fukuda V. I. Chani (Eds.), Additive Manufacturing and Strategic Technologies in Advanced Ceramics, 117-118 (2016)
Patent Document 2: JP 2010-24278 A
Patent Document 3: JP 2017-110042 A

SUMMARY OF THE INVENTION

Problem to be Solved by the Invention

The invention has been made in view of these problems, and an object of the invention is to provide a phosphor and a light source device having the phosphor having a high internal quantum yield, capable of shifting the fluorescence wavelength of yellow fluorescence to the long wavelength side, having satisfactory heat quenching resistance, and excellent in blue light transmittance.

Means for Solving Problem

In order to achieve the above object, a phosphor according to the invention comprises a Ce:YAG single crystal having a Ce amount of 0.7 parts by mole or more when a total amount of Y and Ce is 100 parts by mole.

Since the phosphor according to the invention is the single crystal, the phosphor has almost no grain boundary or phase boundary, and thus scattering at a grain boundary or a phase boundary is unlikely to occur. Accordingly, high blue light transmittance can be obtained.

Further, the phosphor according to the invention enables a large Ce amount, and thus a high luminous efficiency can be obtained from a high internal quantum yield and the fluorescence wavelength of yellow fluorescence can be shifted to the long wavelength side. Accordingly, it is possible to obtain mixed light closer to the white on a chromaticity table by mixing the yellow fluorescence with blue transmitted light.

It is preferable for the phosphor that the Ce amount is 1.0 part by mole or more when the total amount of Y and Ce is 100 parts by mole.

By increasing the Ce amount as described above, it is possible to obtain a higher luminous efficiency from a higher internal quantum yield and the fluorescence wavelength of the yellow fluorescence can be further shifted to the long wavelength side.

It is preferable that the phosphor has a fluorescence wavelength of 540 nm or more.

Thereby, it is possible to obtain mixed light close to the white on the chromaticity table when the yellow fluorescence of the phosphor is combined with the blue transmitted light.

It is preferable for the phosphor that a relative value (%) of an internal quantum yield at 200° C. with respect to an internal quantum yield at room temperature (25° C.) by blue light of 450 nm is 95% or more.

Since the phosphor of the invention has satisfactory heat quenching resistance as described above, the phosphor is capable of maintaining excellent light emission characteristics even in a high temperature environment.

It is preferable that the phosphor is produced by a micro pull-down (μ-PD) method.

Thereby, a single crystal having a uniform Ce concentration can be obtained. In addition, unlike by the CZ method, 0.7 parts by mole or more of Ce can be added when the total amount of Y and Ce is 100 parts by mole.

A light source device according to the invention includes the phosphor according to the invention and a blue light emitting diode and/or a blue semiconductor laser.

With such a configuration, the light source device according to the invention is applicable as a white light source.

BRIEF DESCRIPTION OF DRAWINGS

FIGURE is a schematic cross-sectional view of a single crystal manufacturing apparatus for manufacturing a phosphor according to the present embodiment.

MODE(S) FOR CARRYING OUT THE INVENTION (Phosphor)

A phosphor according to the present embodiment is a YAG-based single crystal (Ce:YAG single crystal) containing Ce as an activator. Since the phosphor according to the present embodiment is the single crystal, the phosphor has almost no grain boundary or phase boundary, and thus a higher blue light transmittance can be obtained than in the case of eutectics or polycrystalline transparent ceramics.

It should be noted that the blue light transmittance of the phosphor means the transmittance of blue light of a predetermined wavelength with which the phosphor is irradiated.

The fact that the phosphor is the single crystal can be confirmed by the crystal peak of the YAG single crystal being confirmed by XRD.

When the total amount of Y and Ce is 100 parts by mole, the phosphor according to the present embodiment has a Ce amount of 0.7 parts by mole or more. As a result, a high luminous efficiency can be obtained from a high internal quantum yield, the fluorescence wavelength of yellow fluorescence can be shifted to the long wavelength side, and it is possible to obtain mixed light closer to the white on the JIS standard chromaticity table by mixing with blue transmitted light.

From the above viewpoint, the phosphor preferably has a Ce amount of 1.0 part by mole or more and more preferably has a Ce amount of 1.0 part by mole to 2.0 parts by mole when the total amount of Y and Ce is 100 parts by mole.

It should be noted that the internal quantum yield refers to the conversion efficiency between excitation light and fluorescence. Specifically, the internal quantum yield is calculated as m/n based on the number of photons (m) absorbed by the phosphor when irradiation with blue light of a predetermined excitation wavelength is performed and the number of photons (n) of the converted light that is obtained by the absorbed photons being converted.

In addition, here, the fluorescence wavelength refers to the strongest wavelength (peak wavelength) in the fluorescence spectrum.

The phosphor according to the present embodiment has a fluorescence wavelength of 540 nm or more. As a result, it is possible to obtain mixed light close to the white on the chromaticity table when the yellow fluorescence of the phosphor according to the present embodiment is combined with blue transmitted light. From the above viewpoint, the phosphor according to the present embodiment preferably has a fluorescence wavelength of 540 nm to 570 nm.

In the phosphor of the present embodiment, the relative value (%) of the internal quantum yield at 200° C. is 95% or more with respect to the internal quantum yield at room temperature (25° C.) by blue light of 450 nm. It should be noted that this relative value is an evaluation value of heat quenching resistance. Since the phosphor of the present embodiment has satisfactory heat quenching resistance as described above, the phosphor is capable of maintaining excellent light emission characteristics even in a high temperature environment. From the above viewpoint, the phosphor according to the present embodiment preferably has a relative value (%) of the internal quantum yield at 200° C. of 98% or more with respect to the internal quantum yield at room temperature (25° C.) by blue light of 450 nm.

It should be noted that the polycrystalline transparent ceramics are likely to undergo a partial change in thermal energy in returning from the excited state to the ground state due to the minute air gaps at the crystal grain boundary and are inferior in heat quenching resistance to single crystals.

Examples of the composition of the YAG-based single crystal, which is not particularly limited, include $(Y_{1-x-y-z}\alpha_x\beta_y Ce_z)_{3+a}Al_{5-a}O_{12}$ ($0 \leq x \leq 0.9994$, $0 \leq y \leq 0.0669$, $0.007 \leq z$, $-0.016 \leq a \leq 0.315$).

Here, $\alpha$ and $\beta$ are components that substitute Y. Examples of the $\alpha$ and $\beta$ elements include Lu, Gd, Tb and La.

(Single Crystal Manufacturing Apparatus)

FIGURE illustrates a schematic cross-sectional view of a single crystal manufacturing apparatus 2 using the μ-PD method. In the μ-PD method, which is a melt solidification method, the melt of a target substance is obtained in a crucible 4 by the sample-containing crucible 4 being directly or indirectly heated. Then, a seed crystal 14 installed below the crucible 4 is brought into contact with an opening portion at the lower end of the crucible 4. The seed crystal 14 is pulled down while a solid-liquid interface is formed there, and a single crystal is grown as a result.

It is preferable that the phosphor according to the present embodiment is produced by the μ-PD method. Thereby, Ce is uniformly contained at each cutting position when individual parts are cut from the produced single crystal and a Ce:YAG single crystal containing 0.7 parts by mole or more of Ce is obtained when the total amount of Y and Ce is 100 parts by mole. In other words, by using the μ-PD method, it is possible to obtain a single crystal with a Ce concentration segregation coefficient close to 1.0. The segregation coefficient is calculated by the following equation (1).

[Equation 1]

$$\frac{C_{crystal}}{C_{melt}} = k_{eff}(1-g)^{(k_{eff}-1)} \qquad (1)$$

$C_{crystal}$: Ce concentration in crystal
$C_{melt}$: Ce concentration in liquid phase
$k_{eff}$: Effective segregation coefficient
g: Solidification rate (=longitudinal position of crystal)

The single crystal produced by the μ-PD method is capable of bringing the segregation coefficient of Ce concentration to close to 1.0. In contrast, a single crystal produced by the CZ method has a Ce concentration segregation coefficient of approximately 0.1 to 0.2 (Non-Patent Document 1). As described above, the single crystal produced by the μ-PD method tends to have a uniform Ce concentration along the pull-down direction as compared with the single crystal produced by the CZ method.

It should be noted that the Ce concentration in the crystal can be measured by LA-ICP-MS, EPMA, EDX or the like. The Ce concentration in the liquid phase can be measured by ICP-AES or ICP-MS.

As illustrated in FIGURE, the single crystal manufacturing apparatus 2 for manufacturing the single crystal phosphor according to the present embodiment includes the crucible 4 installed such that the opening portion is directed downward and a refractory furnace 6 surrounding the crucible 4. Further, the refractory furnace 6 is covered with a quartz tube 8, and an induction heating coil 10 for heating the crucible 4 is installed near the lengthwise center of the quartz tube 8.

The seed crystal 14 held by a seed crystal holding jig 12 is installed in the opening portion of the crucible 4. In addition, an after heater 16 is installed near the opening portion of the crucible 4.

It should be noted that the single crystal manufacturing apparatus 2 is provided with decompression means (not illustrated) for decompressing the inner portion of the refractory furnace 6, pressure measuring means (not illustrated) for monitoring the decompression, temperature measuring means (not illustrated) for measuring the temperature of the refractory furnace 6, and gas supply means (not illustrated) for supplying an inert gas into the refractory furnace 6.

A single crystal cut into a rod shape is used as the seed crystal 14. The seed crystal is preferably an additive-free YAG single crystal.

The material of the seed crystal holding jig 12 is not particularly limited. Preferable is, for example, dense alumina having little effect at around 1,900° C. as a use temperature. The shape and size of the seed crystal holding jig 12 are not particularly limited. Preferable is a rod shape with a diameter resulting in no contact with the refractory furnace 6.

The melting point of the single crystal is high, and thus the material of the crucible 4 and the after heater 16 is preferably Ir, Mo, or the like. In addition, it is more preferable to use Ir as the material of the crucible 4 in order to prevent foreign matter from contaminating the single crystal as a result of oxidation of the material of the crucible 4. It should be noted that Pt can be used as the material of the crucible 4 in a case where a substance having a melting point of 1,500° C. or less is a target. In addition, crystal growth in the atmosphere is possible in a case where Pt is used as the material of the crucible 4. In a case where a substance having a high melting point exceeding 1,500° C. is a target, Ir or the like is used as the material of the crucible 4 and the after heater 16, and thus crystal growth is performed only in an atmosphere of an inert gas such as Ar.

It is preferable that the opening portion of the crucible 4 has a diameter of approximately 200 μm to 400 μm and a flat shape from the viewpoint of the low viscosity of the single crystal melt and wettability with respect to the crucible 4.

Although the material of the refractory furnace 6 is not particularly limited, the material is preferably alumina from the viewpoint of heat retention, use temperature, and prevention of crystal contamination attributable to impurities.

(Single Crystal Manufacturing Method)

Next, a method for manufacturing the phosphor (single crystal) according to the present embodiment will be described.

First, a YAG raw material as a single crystal raw material and Ce are placed in the crucible 4 in the refractory furnace 6, and the inside of the furnace is substituted with an inert gas such as $N_2$ and Ar.

Next, the crucible 4 is heated by means of the induction heating coil (high frequency coil for heating) 10 while the inert gas flows in at 10 to 100 $cm^3$/min, the raw material is melted, and the melt is obtained.

When the raw material is sufficiently melted, the seed crystal 14 is gradually brought close from the lower portion of the crucible, and the seed crystal 14 is brought into contact with the opening portion at the lower end of the crucible 4. When the melt comes out of the opening portion at the lower end of the crucible 4, the seed crystal 14 is lowered and crystal growth is initiated.

The crystal growth rate is manually controlled, along with the temperature, while the state of the solid-liquid interface is observed by means of a CCD camera or a thermo camera.

By the induction heating coil 10 moving, a temperature gradient can be selected in the range of 10° C./mm to 100° C./mm. In addition, the growth rate of the single crystal can also be selected in the range of 0.01 mm/min to 30 mm/min.

The seed crystal is lowered until the melt in the crucible 4 does not come out and, after the seed crystal is separated from the crucible 4, cooling is performed such that the single crystal does not crack. It is possible to increase the rate of melt withdrawal by setting a steep temperature gradient between the crucible 4 and the after heater 16 and below as described above.

During the crystal growth and cooling, the inert gas keeps flowing into the refractory furnace 6 under the same conditions as during the heating. It is preferable to use an inert gas such as $N_2$ and Ar as the atmosphere in the furnace.

(Light Source Device)

A light source device according to the present embodiment has at least the phosphor according to the present embodiment and a blue light emitting diode (blue LED) or a blue semiconductor laser (blue LD). Hereinafter, the blue light emitting diode and the blue semiconductor laser will be collectively referred to as a "blue light emitting element".

The blue light emitting element emits excitation light for exciting the phosphor. Any blue light emitting element can be selected from those with a peak wavelength of 405 nm to 460 nm. Those with a peak wavelength of 425 nm to 460 nm are generally used especially as white light sources.

The blue light emitting element and the phosphor may be in close contact with each other or may be separated from each other. In addition, a transparent resin or an air gap may be provided between the blue light emitting element and the phosphor.

The invention is not limited to the embodiment described above and can be variously modified within the scope of the invention.

EXAMPLE

Hereinafter, the invention will be described based on more detailed examples, which do not limit the invention.

(Sample No. 1 to 6)

A Ce:YAG single crystal was produced by the μ-PD method and by means of the single crystal manufacturing apparatus 2 illustrated in FIGURE.

The crucible 4 made of Ir and having an inner diameter of 20 mm was charged with 10 g of the YAG raw material as a starting raw material and Ce as an additive was added so as to reach the amount shown in Table 1. The refractory furnace 6 was charged with the crucible 4 charged with the raw material, the pressure in the refractory furnace 6 was set to a decompression atmosphere, and $N_2$ gas was caused to flow at a flow rate of 50 $cm^3$/min.

Subsequently, heating of the crucible 4 was initiated and the crucible 4 was gradually heated for one hour until the melting point of the YAG single crystal was reached. The YAG single crystal was used as the seed crystal 14 and the seed crystal 14 was raised to close to the melting point of the YAG The tip of the seed crystal 14 was brought into contact with the opening portion at the lower end of the crucible 4 and the temperature was gradually raised until the melt came out of the opening portion. When the melt came out of the opening portion at the lower end of the crucible 4, crystal growth was performed at a rate of 0.20 mm/min while the seed crystal 14 was gradually lowered.

As a result, a 2 mm-square Ce:YAG single crystal with a length of 300 mm was obtained. It should be noted that the effective segregation coefficient of the Ce:YAG single crystal of Sample No. 2 was 0.6.

It should be noted that the effective segregation coefficient was calculated by LA-ICP-MS-based measurement of the Ce concentration in the crystal, ICP-AES-based measurement of the Ce concentration in the liquid phase, and fitting to the above equation (1).

The obtained single crystal was evaluated by the following method.

Single Crystal

The crystal peak of the YAG single crystal was confirmed by XRD and it was confirmed that the YAG single crystal was a single crystal by the confirmation that no different-phase component was contained.

Fluorescence Wavelength

The fluorescence wavelength was measured at 25° C., 200° C., and 300° C. by means of an F-7000 type spectrofluorometer produced by Hitachi High-Tech Corporation. The measurement mode was a fluorescence spectrum and the measurement conditions were an excitation wavelength of 450 nm and a photomal voltage of 400 V.

Internal Quantum Yield Ratio and Heat Quenching Resistance

The internal quantum yield was measured at 25° C., 200° C., and 300° C. by means of the F-7000 type spectrofluorometer produced by Hitachi High-Tech Corporation as a measuring device. The measurement mode was a fluorescence spectrum and the measurement conditions were an excitation wavelength of 450 nm and a photomal voltage of 400 V.

$\eta_{int\ 25°\ C.}$ in Table 1 indicates the ratio of the internal quantum yield of each sample to the internal quantum yield of Sample No. 2 at 25° C. (internal quantum yield ratio). $\eta_{int\ 200°\ C.}/\eta_{int\ 25°\ C.}$ in Table 1 indicates the ratio of the internal quantum yield of each sample at 200° C. to the internal quantum yield of each sample at 25° C. (heat quenching resistance). $\eta_{int\ 300°\ C.}/\eta_{int\ 25°\ C.}$ in Table 1 indicates the ratio of the internal quantum yield of each sample at 300° C. to the internal quantum yield of each sample at 25° C. (heat quenching resistance). The heat quenching resistance should be close to 1.

Blue Light Transmittance Ratio

The blue light transmittance was measured by means of a V660 spectrometer produced by JASCO Corporation as a measuring device. The measurement wavelength was 460 nm. Table 1 shows the ratio of the blue light transmittance of each sample to the blue light transmittance of Sample No. 2 (blue light transmittance ratio).

(Sample No. 11 to 22)

As comparative examples, evaluation values of eutectics, transparent ceramics, and CZ method-based single crystals with different Ce amounts were calculated by simulation. Table 1 shows the results.

It should be noted that it is impossible to manufacture a CZ method-based single crystal containing 0.7 parts by mole or more of Ce and thus no evaluation value is described as to the single crystal.

TABLE 1

| Sample No. | Composition base | Target | Ce amount※ [part by mole] | Emission wavelength of yellow fluorescence | Internal quantum yield ratio $\eta_{int\ 25°C.}$ | Heat quenching resistance $\eta_{int\ 200°C.}/\eta_{int\ 25°C.}$ | Heat quenching resistance $\eta_{int\ 300°C.}/\eta_{int\ 25°C.}$ | Blue light transmittance ratio (wavelength 460 nm) |
|---|---|---|---|---|---|---|---|---|
| 11 | Ce:YAG/ | Eutectic | 0.05 | 532 | 0.954 | 0.929 | 0.699 | 0.989 |
| 12 | Al$_2$O$_3$ | (simulation) | 0.1 | 536 | 0.965 | 0.936 | 0.703 | 0.986 |
| 13 | | | 0.7 | 540 | 0.985 | 0.942 | 0.700 | 0.980 |
| 14 | | | 1 | 552 | 1 | 0.929 | 0.698 | 0.972 |
| 15 | | | 5 | 570 | 1.025 | 0.939 | 0.701 | 0.966 |
| 16 | Ce:YAG | Transparent | 0.05 | 532 | 0.954 | 0.929 | 0.699 | 0.989 |
| 17 | | ceramics | 0.1 | 536 | 0.965 | 0.936 | 0.703 | 0.986 |
| 18 | | (simulation) | 0.7 | 540 | 0.985 | 0.942 | 0.700 | 0.980 |
| 19 | | | 1 | 552 | 1 | 0.929 | 0.698 | 0.972 |
| 20 | | | 5 | 570 | 1.025 | 0.939 | 0.701 | 0.966 |
| 21 | | CZ single crystal | 0.05 | 532 | 0.954 | 0.989 | 0.976 | 1.017 |
| 22 | | (simulation) | 0.1 | 536 | 0.965 | 0.997 | 0.981 | 1.014 |
| 5 | | μ-PD single | 0.05 | 532 | 0.954 | 0.989 | 0.976 | 1.017 |
| 6 | | crystal | 0.1 | 534 | 0.965 | 0.980 | 0.975 | 1.014 |
| 1 | | | 0.7 | 540 | 0.985 | 0.987 | 0.981 | 1.007 |
| 2 | | | 1 | 542 | 1 | 0.989 | 0.974 | 1 |
| 3 | | | 5 | 552 | 1.025 | 1 | 0.979 | 0.994 |
| 4 | | | 10 | 570 | 1.063 | 0.991 | 0.983 | 0.986 |

※Ce amount at a total amount of Y and Ce of 100 parts by mole

As for the Ce:YAG single crystal-based phosphors, it could be confirmed that the fluorescence wavelength was closer to the long wavelength side and the internal quantum yield ratio and the heat quenching resistance were more satisfactory at a Ce amount of 0.7 parts by mole or more (Sample No. 1 to 4) than at a Ce amount of 0.1 parts by mole or less (Sample No. 5 and 6).

It could be confirmed that the Ce:YAG single crystals with a Ce amount of 0.7 parts by mole or more (Sample No. 1 to 4) were more satisfactory in heat quenching resistance than the Ce:YAG/Al$_2$O$_3$ eutectics with a Ce amount of 0.05 to 5 parts by mole (Sample No. 11 to 15).

It could be confirmed that the Ce:YAG single crystals with a Ce amount of 0.7 parts by mole or more (Sample No. 1 to 4) were more satisfactory in blue light transmittance ratio than the Ce:YAG/Al$_2$O$_3$ eutectics with a Ce amount of 0.7 to 5 parts by mole (Sample No. 13 to 15).

It is conceivable that the eutectics are inferior in blue light transmittance ratio to the Ce:YAG single crystals because the eutectics cause light scattering at phase boundaries.

It could be confirmed that the Ce:YAG single crystals with a Ce amount of 0.7 parts by mole or more (Sample No. 1 to 4) were more satisfactory in heat quenching resistance than the Ce:YAG transparent ceramics with a Ce amount of 0.05 to 5 parts by mole (Sample No. 16 to 20).

It could be confirmed that the Ce:YAG single crystals with a Ce amount of 0.7 parts by mole or more (Sample No. 1 to 4) were more satisfactory in blue light transmittance ratio than the Ce:YAG transparent ceramics with a Ce amount of 0.7 to 5 parts by mole (Sample No. 18 to 20).

It could be confirmed that the μ-PD method-based Ce:YAG single crystals with a Ce amount of 0.7 parts by mole or more (Sample No. 1 to 4) were more satisfactory in internal quantum yield ratio than the CZ method-based Ce:YAG transparent ceramics with a Ce concentration of 0.05 to 0.1 parts by mole (Sample No. 21 and 22).

In addition, more than 0.1 parts by mole of Ce cannot be contained by the CZ method. It is conceivable that this is because the segregation coefficient of an additive such as Ce decreases as crystal growth is slower by the CZ method than by the μ-PD method and the concentration of the additive incorporated into the crystal decreases as a result.

EXPLANATIONS OF LETTERS OR NUMERALS

2 SINGLE CRYSTAL MANUFACTURING APPARATUS
4 CRUCIBLE
6 REFRACTORY FURNACE
8 QUARTZ TUBE
10 INDUCTION HEATING COIL
12 SEED CRYSTAL HOLDING JIG
14 SEED CRYSTAL
16 AFTER HEATER

The invention claimed is:

1. A phosphor comprising a Ce:YAG single crystal having a Ce amount of 0.7 parts by mole or more in which a total amount of Y and Ce is 100 parts by mole, wherein a relative value (%) of an internal quantum yield at 200° C. with respect to an internal quantum yield at 25° C. by blue light of 450 nm is 95% or more.

2. The phosphor according to claim 1, wherein the Ce amount is 1.0 part by mole or more in which the amount of Y and Ce is 100 parts by mole.

3. The phosphor according to claim 1 having a fluorescence wavelength of 540 nm or more.

4. The phosphor according to claim 1 produced by a micro pull-down method.

5. A light source device comprising:
the phosphor according to claim 1; and
a blue light emitting diode and/or a blue semiconductor laser.

6. The phosphor according to claim 1, wherein the Ce amount is 1.0 part to 2.0 parts by mole in which the amount of Y and Ce is 100 parts by mole.

7. The phosphor according to claim 1 having a fluorescence wavelength of 540 nm to 570 nm.

8. The phosphor according to claim 1, wherein a relative value (%) of an internal quantum yield at 200° C. with respect to an internal quantum yield at 25° C. by blue light of 450 nm is 98% or more.

9. The phosphor according to claim 1, wherein the Ce:YAG single crystal has the following formula:
$(Y_{1-x-y-z}\alpha_x\beta_y Ce_z)_{3+a}Al_{5-a}O_{12}$, wherein ($0 \leq x \leq 0.9994$, $0 \leq y \leq 0.0669$, $0.007 \leq z$, $-0.016 \leq a \leq 0.315$), and the α and β elements are selected from the group consisting Lu, Gd, Tb and La.

* * * * *